United States Patent
Bauch et al.

(10) Patent No.: US 7,254,183 B2
(45) Date of Patent: Aug. 7, 2007

(54) DUAL LINK DVI TRANSMITTER SERVICED BY SINGLE PHASE LOCKED LOOP

(75) Inventors: Jeffrey Bauch, Torrance, CA (US); Richard Berard, Pasadena, CA (US); Christopher R. Pasqualino, Glendora, CA (US); Stephen G. Petilli, Pasadena, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/516,301

(22) Filed: Sep. 5, 2006

(65) Prior Publication Data

US 2007/0002965 A1 Jan. 4, 2007

Related U.S. Application Data

(63) Continuation of application No. 10/145,411, filed on May 14, 2002, now Pat. No. 7,120,203.

(60) Provisional application No. 60/356,322, filed on Feb. 12, 2002.

(51) Int. Cl.
*H04L 27/04* (2006.01)
(52) U.S. Cl. ............ 375/295; 375/256; 375/257
(58) Field of Classification Search ............ 375/219, 375/220, 256, 257, 259, 260, 286, 288, 294, 375/295, 354, 356, 370, 371, 376, 377; 370/227, 370/228; 307/54, 407, 409
See application file for complete search history.

(56) References Cited

U.S. PATENT DOCUMENTS

| | | | |
|---|---|---|---|
| 4,821,296 A | 4/1989 | Cordell | |
| 5,008,636 A | 4/1991 | Markinson et al. | |
| 5,069,521 A | 12/1991 | Hardwick | |
| 5,278,873 A | 1/1994 | Lowrey et al. | |
| 5,528,638 A | 6/1996 | Rajivan | |
| 5,648,994 A | 7/1997 | Kao | |
| 5,726,607 A | 3/1998 | Brede et al. | |
| 5,734,301 A | 3/1998 | Lee et al. | |
| 5,905,769 A | 5/1999 | Lee et al. | |
| 6,167,077 A | 12/2000 | Ducaroir et al. | |
| 6,233,289 B1 * | 5/2001 | Fredrickson | 375/341 |
| 6,297,702 B1 | 10/2001 | Locker et al. | |
| 6,510,473 B1 | 1/2003 | Voit | |
| 6,954,491 B1 * | 10/2005 | Kim et al. | 375/220 |

(Continued)

OTHER PUBLICATIONS

Digital Display Working Group, Digital Visual Interface DVI Revision 1.0, Apr. 2, 1999.

*Primary Examiner*—Jay K. Patel
*Assistant Examiner*—Naheed Ejaz
(74) *Attorney, Agent, or Firm*—Garlick Harrison & Markison

(57) ABSTRACT

A dual link transmitter constructed according to the present invention employs a single Phase Locked Loop (PLL) to service both a primary link and a secondary link during dual link mode operations. The structure of the dual link transmitter includes both a primary link PLL and a secondary link PLL. The primary link PLL produces a primary link clock and the secondary link PLL produces a secondary link clock. During dual single link operations, the primary link clock is used to service the primary link while the secondary link clock is used to service the secondary link. However, during dual link operations, the primary link clock is used to service both the primary link and the secondary link.

17 Claims, 9 Drawing Sheets

U.S. PATENT DOCUMENTS

| | | | |
|---|---|---|---|
| 2003/0039168 A1* | 2/2003 | Chan et al. | 365/233 |
| 2003/0149987 A1* | 8/2003 | Pasqualino et al. | 725/80 |
| 2003/0208779 A1 | 11/2003 | Green et al. | |
| 2005/0105486 A1* | 5/2005 | Robinett et al. | 370/321 |

* cited by examiner

DUAL LINK DVI TRANSMITTER SERVICED BY SINGLE PHASE LOCKED LOOP

CROSS REFERENCE TO RELATED APPLICATION

This application is a continuation of and claims priority to U.S. patent application having an application Ser. No. 10/145,411; filed May 14, 2002 now U.S. Pat. No. 7,120,203; which application claims priority to U.S. Provisional Patent Application Ser. No. 60/356,322, filed Feb. 12, 2002; and in which both applications are hereby incorporated by reference in this application.

FIELD OF THE INVENTION

This invention relates generally to digital communications; and more particularly to high-speed serial data communications.

BACKGROUND OF THE INVENTION

Communication technologies that link electronic devices are well known in the art. Some communication technologies link electronic devices via networks. Examples of such networks include wired computer networks, wireless computer networks, wired telephone networks, wireless telephone networks, and satellite communication networks, among other networks. Within such communication networks, a network infrastructure couples electronic devices to one another. Other communication technologies simply link one electronic device to another electronic device. Examples of these types of links include links between computers and their peripheral devices, links between portable data units and computers, links between video devices sources and video monitors, and links between audio sources and audio playback devices, among other examples. With regard to the computer and peripheral device example, communication links couple the computer to its display, the computer to its printer, the computer to its mouse, and the computer to its keyboard, among links.

Many communication link applications require high data rate throughput with minimal or no errors in the data transmitted. Some of these communication links operate in a parallel fashion in which data is carried on a plurality of physical conductors and is clocked in unison. Other of these communication links operates in a serial fashion in which data is carried on a single physical conductor or multiple physical conductors from the first device to the second device in a serial fashion.

One particular type of serial link is a high-speed bit stream serial link. In a high-speed bit stream serial link, data is transmitted from a transmitting device to a receiving device one bit at a time so that, over time, a plurality of bits of data are transferred. An example of such a high-speed bit stream serial link is described generally in the Digital Visual Interface (DVI) standard promulgated by the Digital Display Working Group, which is incorporated herein by reference for all purposes. The DVI standard sets forth a high-speed bit stream serial link that carries display information from a video source (transmitter) to a video display (receiver), in one operation. The transmitter may be contained in a computer, a cable modem set top box, a satellite receiver set top box, or another source of video content while the receiver is typically contained in a monitor that displays the visual information received via the high data rate bit stream DVI serial link.

The DVI standard describes the operational characteristics of the physical communication path between the transmitter and the receiver. The DVI standard provides for one or two DVI links, each of which includes a plurality of bit stream paths (data channels) that is synchronized to a clock signal (bit clock). The bit clock and bits streams may operate at frequencies up to 1.65 Gigahertz. At such operating frequencies, the bit streams traveling along the bit stream path(s) are subject to a number of operating conditions that distort the bits as they pass from the transmitter to the receiver. Distortion of bits caused by dispersion along the conductors carrying the bit streams is generally referred to as inter-symbol interference (ISI). ISI distorts the bits such that extraction of the bits from the bit stream is subject to error. Further, the data bit stream(s) is/are often times not aligned fully with the bit clock. Misalignment between a bit stream and the bit clock typically varies over time and is referred to as bit stream jitter. Bit stream jitter often prevents the successful extraction of bits from the bit stream. Whenever bits are not properly extracted by the receiver from the bit stream, data is lost. However, bit stream jitter is common. In many operations, bit stream jitter makes it extraordinarily difficult to successfully meet a data rate, e.g., an error rate of $10^{-9}$ or less.

In dual link DVI applications, six channels are supported, three channels for a primary link and three channels for a secondary link. The data contained on these channels is theoretically synchronized upon its transmission such that it arrives at a receiver in a synchronized form. However, the pair of transmitters that service the dual link DVI application may drift with respect to one another such that transmissions are not synchronized with respect to one another. Further, differences in the respective transmission paths that service the dual link DVI may be such to cause the signals to be further offset from one another when they reach respective servicing receivers. Finally, mismatches in operation of a pair of receivers that service the dual link DVI may also introduce skew into the received data path. Resultantly, data that is received in a serial format and converted to a parallel format for each of the dual links may be skewed in time, causing errors in operation of a servicing receiver.

Therefore, there is a need in the art for a DVI transmitter that minimizes transmission skew of data bits during dual link mode operations.

SUMMARY OF THE INVENTION

Thus, in order to overcome the above-described shortcomings, as well as others of the prior devices, a dual link transmitter constructed according to the present invention employs a single Phase Locked Loop (PLL) to service both a primary link and a secondary link during dual link mode operations. By using a single PLL to service both the primary link and the secondary link during dual link mode operations, the data contained in a plurality of primary link data channels are temporally aligned with a plurality of secondary link data channels. Further, a bit clock that is produced that services both the primary link and the secondary link is temporally aligned with the primary link data channels and the secondary link data channels. Thus, the dual link transmitter of the present invention provides the important benefits of not only temporal alignment between the primary link data channel and the secondary link data channel but also the important benefit of providing an aligned clock that services both the primary and secondary links.

The structure of the dual link transmitter includes both a primary link PLL and a secondary link PLL. The primary link PLL produces a primary link clock and the secondary link PLL produces a secondary link clock. During dual single link operations, the primary link clock is used to service the primary link while the secondary link clock is used to service the secondary link. However, during dual link operations, the primary link clock is used to service both the primary link and the secondary link.

Other features and advantages of the present invention will become apparent from the following detailed description of the invention made with reference to the accompanying drawings.

BRIEF DESCRIPTION OF THE DRAWINGS

These and other features, aspects and advantages of the present invention will be more fully understood when considered with respect to the following detailed description, appended claims and accompanying drawings wherein:

DETAILED DESCRIPTION OF THE DRAWINGS

Figure 1A:
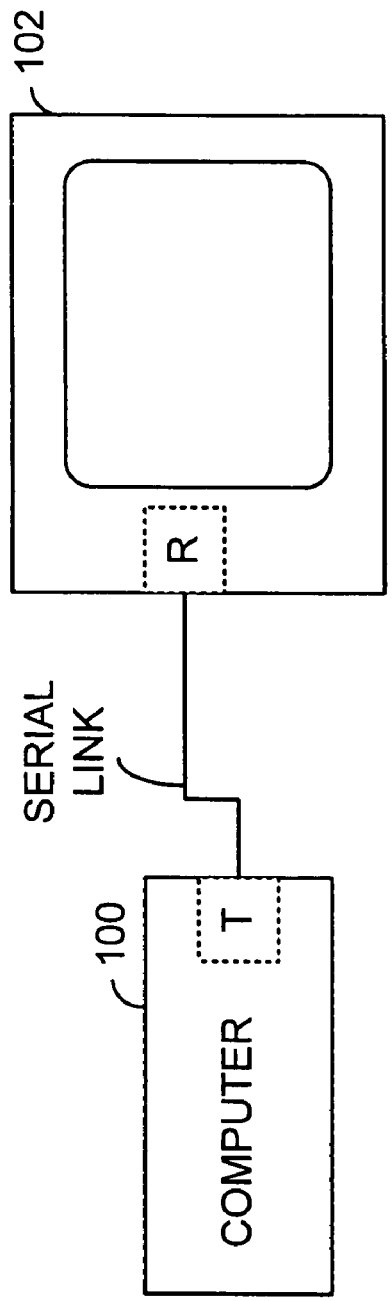
FIG. 1A is a block diagram illustrating a computer and a monitor that intercouple according to the present invention.

FIG. 1A is a block diagram illustrating a computer 100 and a monitor 102 that intercouple according to the present invention. In this embodiment, the computer 100 produces visual information (and audio information in some embodiments) in the form of a high data rate bit stream that it transmits to the monitor 102 via the serial link. As is shown diagrammatically in FIG. 1A, the computer 100 includes a transmitter T while the monitored 102 includes a receiver R. In one embodiment of the serial link, the DVI operating standards are substantially met, except as they may have been modified according to the present invention and as they may be modified by subsequent additions/subtractions for other purposes. In such case, the serial link includes a physical media that carries a plurality of high data rate bit streams and a clock signal (bit clock). The description of the serial link provided herein refers to both single link and dual link mode operations.

Figure 1B:
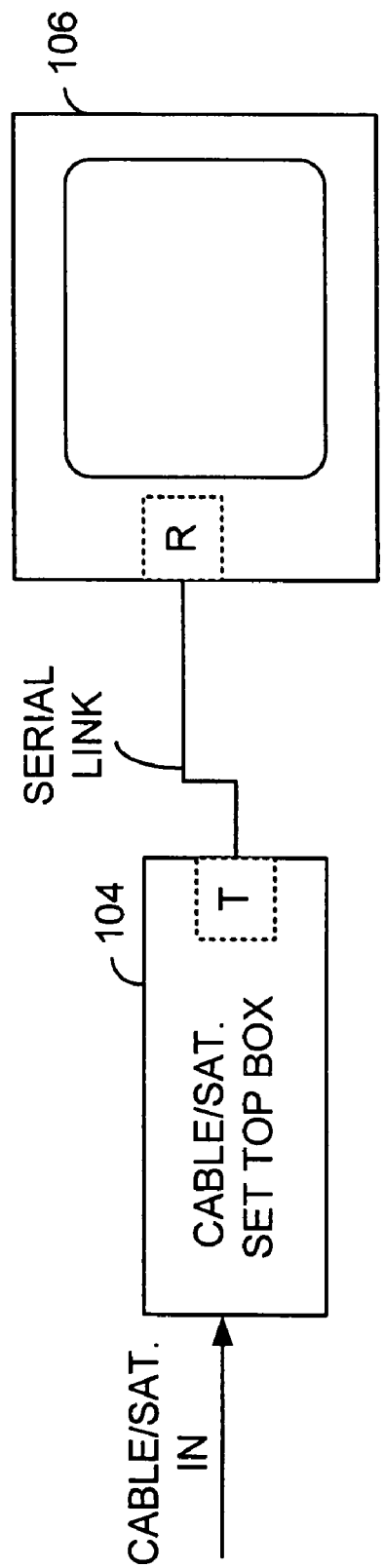
FIG. 1B is a system diagram illustrating a cable/satellite set top box and a video display that intercouple according to the present invention.

FIG. 1B is a system diagram illustrating a cable/satellite set top box and a video display that intercouple according to the present invention. As shown in FIG. 1B, a serial link couples a cable/satellite set top box 104 to a video display 106. The cable/satellite set top box receives input via a cable/satellite input line, processes the cable/satellite input to produce video information, and transmits the video information to the monitor 106 via a serial link that operates according to the present invention. As was the case with the description of FIG. 1A, the serial link of FIG. 1B includes may include a single link DVI or a dual link DVI, both of which are supported by both the cable/satellite set top box 104 and the video display 106.

Figure 2:
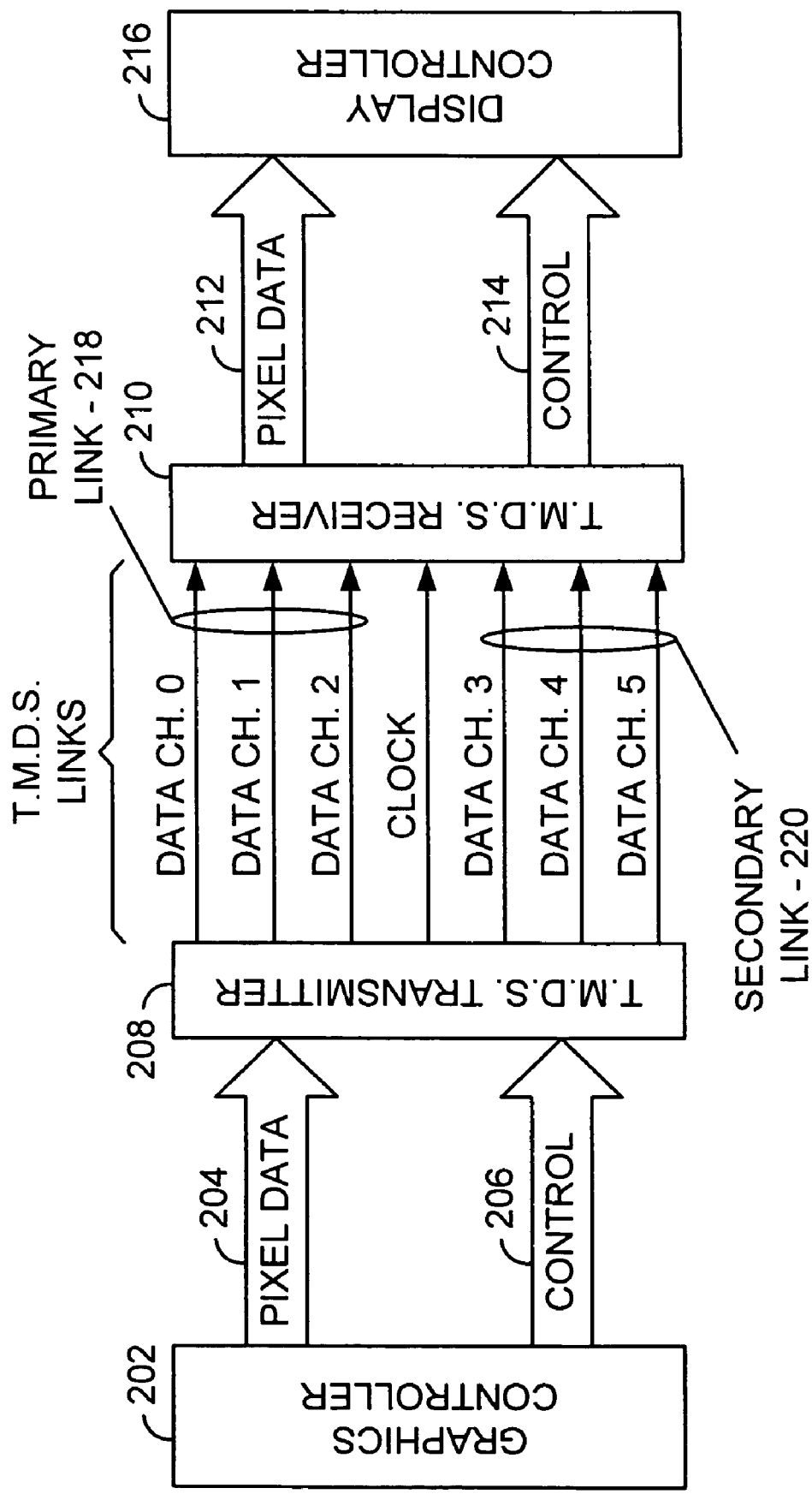
FIG. 2 is a block diagram illustrating a dual link Digital Visual Interface (DVI) that operates according to the present invention.

FIG. 2 is a block diagram illustrating a dual link Digital Visual Interface (DVI) that operates according to the present invention. The dual link DVI couples a graphics controller 202 to a display controller 216. These devices may service the components of FIGS. 1A and 1B, for example. As its output on the transmit side, the graphics controller 202 produces pixel data 204 and control information 206. The pixel data 204 and the control information 206 are received by a Transition Minimized Differential Signaling (T.M.D.S.) transmitter 208 that operates substantially in accordance with the DVI standard. The T.M.D.S. transmitter 208 converts the pixel data 204 and control information 206 into data carried on a plurality of channels and transmits the plurality of channels to a T.M.D.S. receiver 210. A primary link 218 of the dual link DVI includes data channel 0, data channel 1, and data channel 2. A secondary link 220 of the dual link DVI includes data channel 3, data channel 4, and data channel 5. A single/common clock signal (bit clock) services both the primary link 218 and the secondary link 220. In another embodiment, the pixel data 212 also contains audio data.

The T.M.D.S. receiver 210 receives the channels of the primary link 218 and the secondary link 220 and produces pixel data 212 and control information 214 based there upon. The T.M.D.S. receiver 210 provides the pixel data 212 and the control information 214 to a display controller 216. The display controller 216 outputs display data and control to a monitor that creates a visual image based there upon.

According to the present invention, the T.M.D.S. transmitter 208 uses a single Phase Locked Loop (PLL) to generate clocks used to synchronize the transmission of both links during dual link mode operations. Using this technique, the bit streams of the channels of the primary link 218 and the bit streams of the channels of the secondary link 220 are well temporally aligned upon their transmission. With this superior temporal alignment, the bit stream channels arrive at the T.M.D.S. receiver 210 with reduced skew, thus allowing the T.M.D.S. receiver 210 to better receive the channels. According to another aspect of the present invention, when operating as dual single links, the T.M.D.S. transmitter 208 may employ dual PLLs for clock generation. A structure capable of operating in this manner is described with reference to FIG. 4C.

Figure 3:
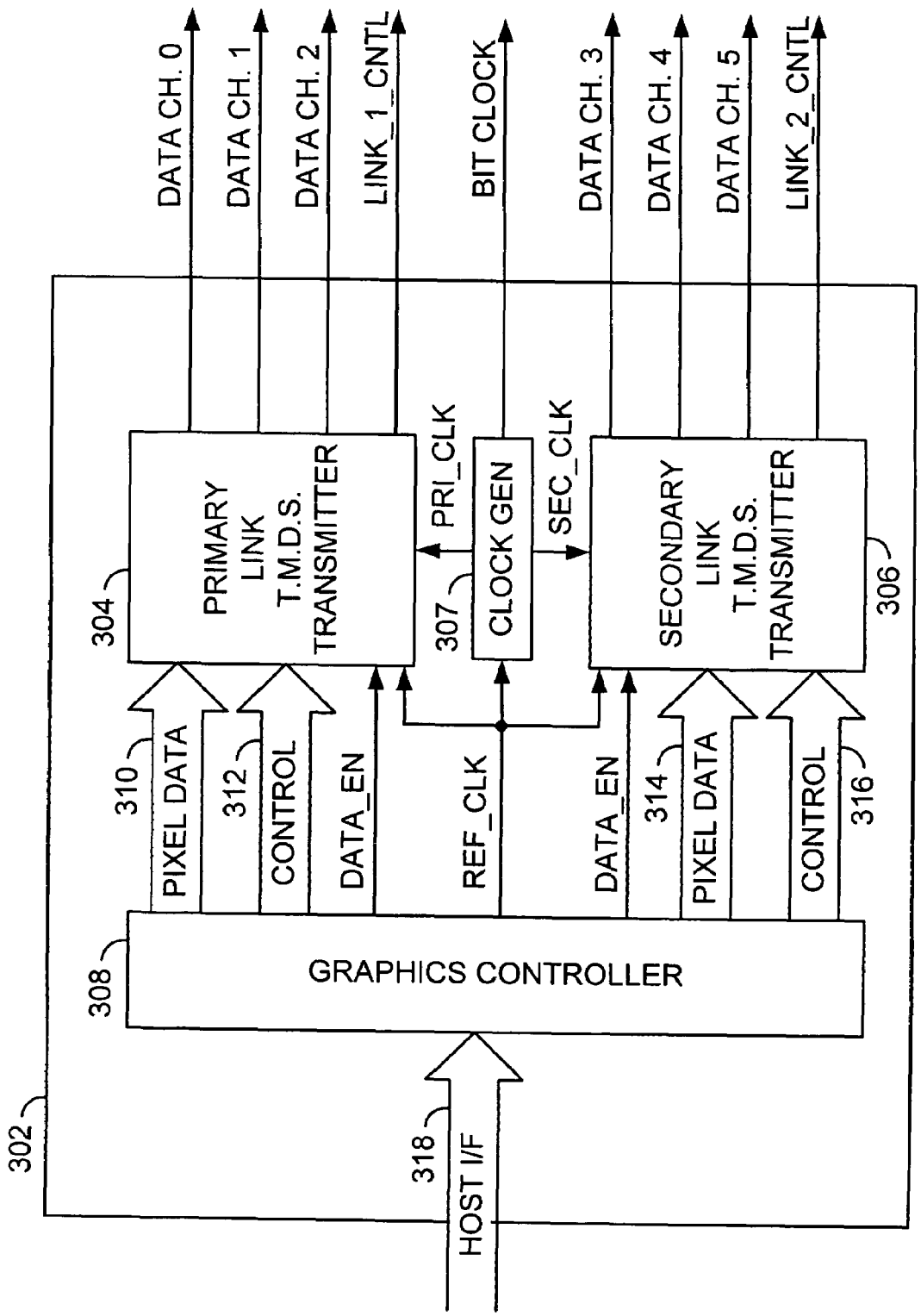
FIG. 3 is a block diagram illustrating the elements of a dual link DVI transmitter constructed according to the present invention.

FIG. 3 is a block diagram illustrating the elements of a dual link DVI transmitter 302 constructed according to the present invention. The dual link DVI transmitter 302 includes a primary link transmitter 304, a secondary link transmitter 306, a dual link clock generator 307, and a graphics controller 308. These components may be formed in a variety of manners. In one embodiment, each of the components of the dual link DVI transmitter 302 are formed as a single integrated circuit. In another embodiment, the graphics controller 308 is formed as one integrated circuit and the primary link transmitter 304, the secondary link transmitter 306, and the dual link clock generator 307 are formed as another integrated circuit. Of course, in still other embodiments, these components may be formed in other manners as well.

The graphics controller 308 couples to a host device, such as one of the host devices illustrated in FIGS. 1A and 1B, and receives video (and audio) data. The graphics controller 308 operates upon the video (and audio) data to produce pixel data (and audio data) and control data. In particular, the graphics controller 308 produces primary link pixel (and audio) data 310 and control data 312 that it provides to the primary link transmitter 304. Likewise, the graphics controller 308 produces secondary link pixel (and audio) data 314 and control data 316 that it provides to the secondary link transmitter 306.

The primary link transmitter 304 converts the primary link pixel (and audio) data 310 and control data 312 into DATA_CH_0, DATA_CH_1, and DATA_CH_2, and LINK_1_CNTL bit streams. Likewise, the secondary link transmitter 306 converts the secondary link pixel (and audio) data 314 and control data 316 into DATA_CH_3, DATA_CH_4, and DATA_CH_5, and LINK_2_CNTL bit streams. These "channels" are transmitted to a dual link DVI receiver contained within a receiving device. The particular format of the "channels" produced by the dual link DVI transmitter 302 are defined within the DVI standard and are described herein only as they relate to the present invention. The reader should know, however, that the DVI standard defines a differential signal format. Thus, the "channels" shown in FIG. 3 have a differential format event though such format is not explicitly shown in FIG. 3.

According to the present invention, the dual link clock generator 307 receives a REF_CLK from the graphics controller 308. The dual link clock generator 307 uses the REF_CLK signal to produce a PRI_CLK for the primary link transmitter 304, a SEC_CLK for the secondary link transmitter 306, and a BIT_CLK for transmission on the dual DVI link. The BIT_CLK The structure of some components of the clock generator 307 are shown in detail with reference to FIGS. 5, 6A, and 6B.

In a single link mode of operation, only the primary link or the secondary link is operational. In a first single link mode of operation only the primary link is operational. In a second single link mode of operation only the secondary link is operational. In each of these single link modes of operation, the BIT_CLK includes a single component that services the operational link, i.e., primary link or secondary link.

In a dual single link mode of operation, both the primary link and the secondary link are operational but they operate independently of one another. In such case, the BIT_CLK includes a primary link bit clock and a secondary link bit clock. In such a mode of operation, the primary link bit clock and the secondary link bit clock are separately generated and may or may not be synchronized. In such case, the dual link clock generator 307 produces the primary link bit clock and the secondary link bit clock separately.

In dual link mode operations, the primary link and the secondary link are synchronized with one another. In such case, the dual link clock generator 307 produces and transmits a single bit clock that services both the primary link and the secondary link. One particular embodiment of the dual link clock generator 307 is described with reference to FIG. 4C. In the embodiment of FIG. 4C, the dual link clock generator 307 includes a pair of Phase Locked Loops (PLLs). In all modes but the dual link mode, each PLL services its respective link, i.e., primary link or secondary link. However, in the dual link mode, a single PLL of the clock generator 307 services both the primary link and the secondary link.

Figure 4A:
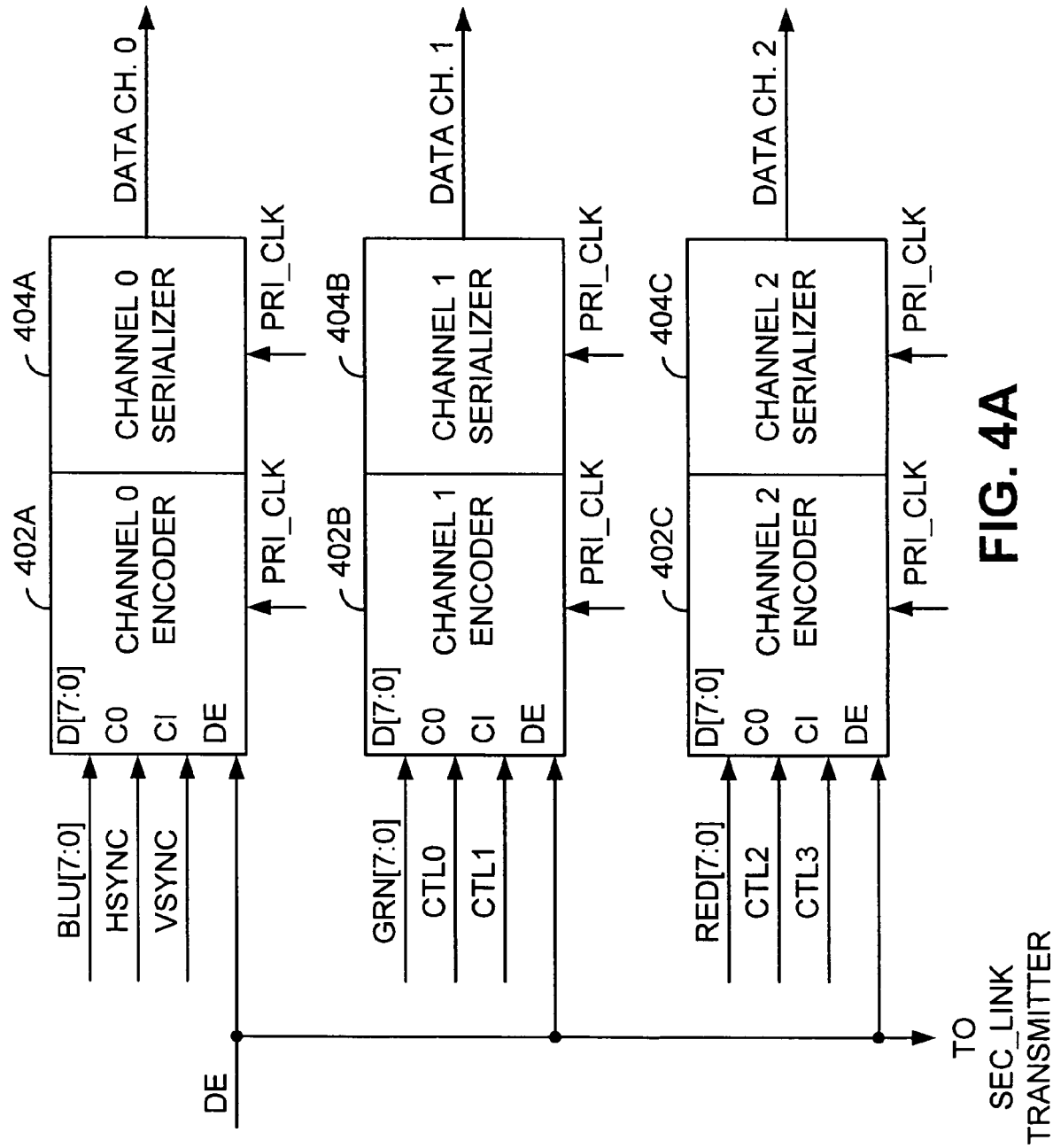
FIGS. 4A and 4B are block diagrams illustrating the structure of encoders and serializers constructed according to the present invention.
Figure 4B:
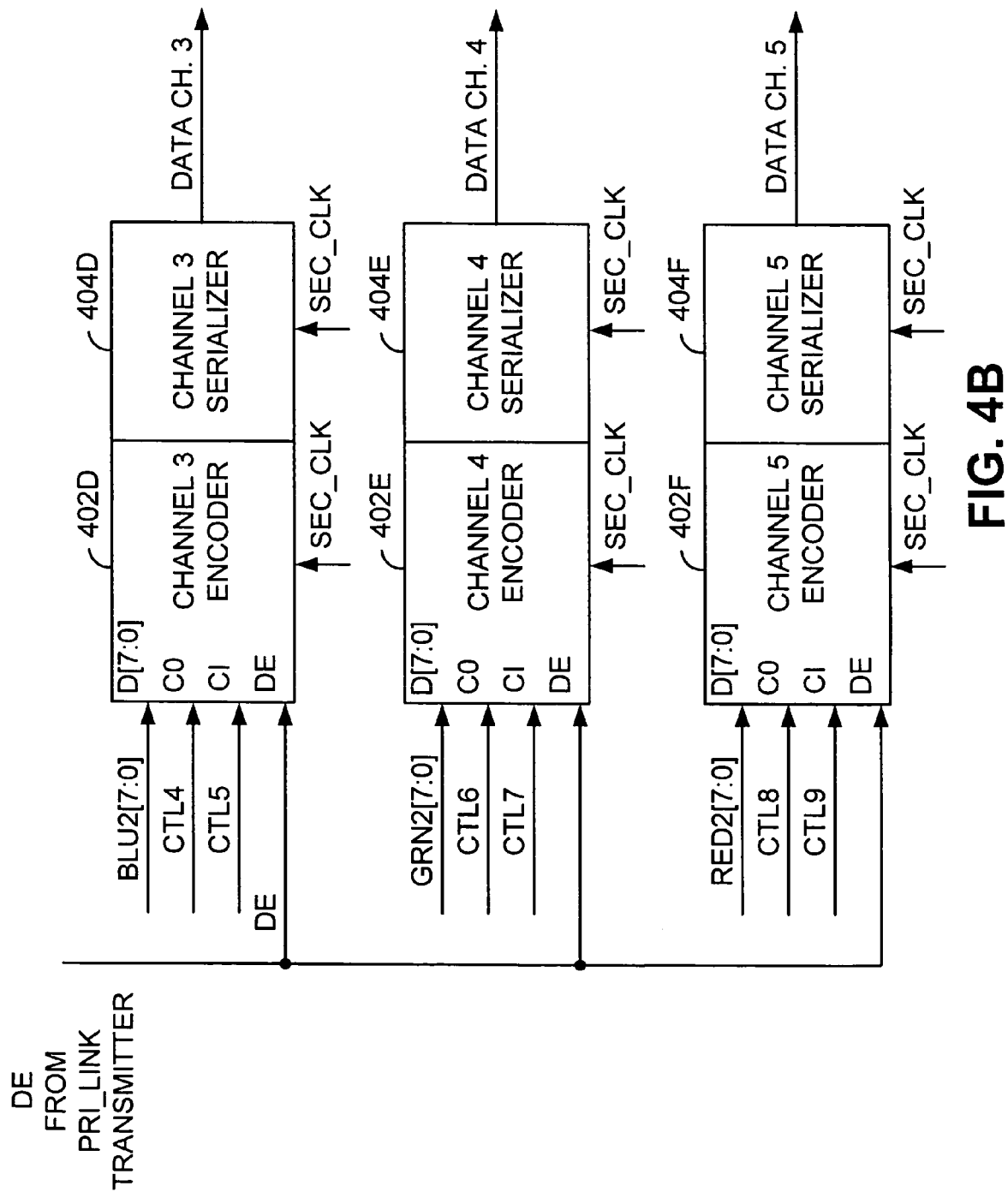
Figure 4C:
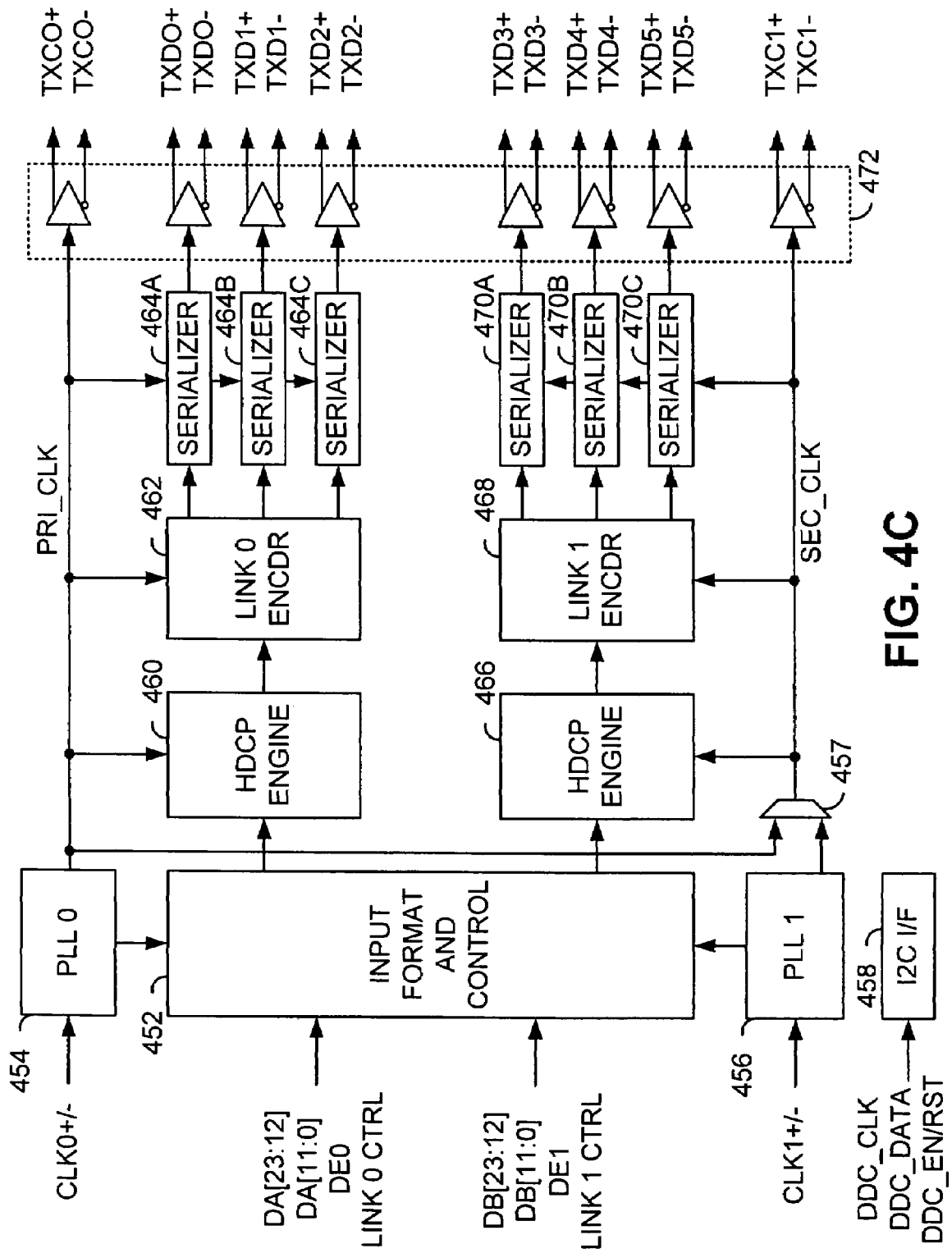
FIG. 4C is a block diagram illustrating a DVI transmitter constructed according to the present invention that supports both single link and dual link mode operations.

FIGS. 4A and 4B are block diagrams illustrating the structure of encoders and serializers constructed according to the present invention. FIG. 4A illustrates channel encoders and serializers that service the primary link while FIG. 4B illustrates channel encoders and serializers that service the secondary link. Referring now to FIG. 4A, channel 0 encoder 402A and channel 0 serializer 404A receives the signals BLU[7:0], HSYNC, VSYNC, DE (Data Enable) and PRI_CLK. The channel 0 encoder 402A encodes the received data and the channel 0 serializer 404A serializes the encoded data and transmits the data as DATA CH. 0. Likewise, the channel 1 encoder 402B and the channel 1 serializer 404B receives the signals GRN[7:0], CTL0, CTL1, DE, and PRI_CLK. The channel 1 encoder 402B encodes the received data and the channel 1 serializer 404B serializes the encoded data and transmits the data as DATA CH. 1. Further, the channel 2 encoder 402C and the channel 2 serializer 404C receives the signals RED[7:0], CTL2, CTL3, DE, and PRI_CLK. The channel 2 encoder 402C encodes the received data and the channel 2 serializer 404C serializes the encoded data and transmits the data as DATA CH. 2.

Referring now to FIG. 4B, secondary link components of the dual link transmitter service the secondary link. In particular, a channel 3 encoder 402D and channel 3 serializer 404D receive the signals BLU2[7:0], CTL4, CTL5, DE (Data Enable) and SEC_CLK. The channel 3 encoder 402D encodes the received data and the channel 3 serializer 404D serializes the encoded data and transmits the data as DATA CH. 3. Likewise, the channel 4 encoder 402E and the channel 4 serializer 404E receives the signals GRN2[7:0], CTL6, CTL7, DE, and SEC_CLK. The channel 4 encoder 402E encodes the received data and the channel 4 serializer 404E serializes the encoded data and transmits the data as DATA CH. 4. Finally, the channel 5 encoder 402F and the channel 5 serializer 404F receives the signals RED2[7:0], CTL8, CTL9, DE, and SEC_CLK. The channel 5 encoder 402F encodes the received data and the channel 5 serializer 404F serializes the encoded data and transmits the data as DATA CH. 5.

FIG. 4C is a block diagram illustrating a DVI transmitter constructed according to the present invention that supports both single link and dual link mode operations. As compared to the embodiment of FIG. 3, the dual link clock generator of FIG. 4C includes a primary link PLL 454 and a secondary link PLL 456. These PLLs 454 and 456 produce clock signals according to the present invention for single link, dual single link, and dual link mode operations.

The DVI transmitter includes an input format and control block 452 that receives the primary link (link 0) and secondary link (link 1) data and control signals from an input device, e.g., a graphics controller 308 such as illustrated in FIG. 3. The input format and control block 452 also receives input from the primary link PLL (PLL 0) 454 and a secondary link PLL (PLL 1) 456 that receive reference clock inputs from the input device. The PLL 0 454 produces the PRI_CLK and the PLL 1 456 produces the SEC_CLK. A multiplexer 457 receives both the PRI_CLK and the SEC_CLK. During single link mode operations, the PRI_CLK is generated by PLL 0 454 while the SEC_CLK is generated by the PLL 1 456. Each of the PRI_CLK and the SEC_CLK is used to produce a respective bit clock, TXCO+/−and TXC1+/−, respectively, that services the corresponding link. However, during the dual link mode operations, the multiplexer 457 operates such that the PLL 0 454 produces both the PRI_CLK and the SEC_CLK. The PRI_CLK is used to produce the bit clock TXCO+/−that services both the primary link and the secondary link during dual link mode operations.

The primary link includes a High-Bandwidth Digital Content Protection (HDCP) engine 460, link 0 encoder 462, and serializers 464A, 464B, and 464C. The secondary link includes HDCP engine 466, link 1 encoder 468, and serializers 470A, 470B, and 470C. The outputs of the serializers (as well as the PRI_CLK and SEC_CLK signals) are differentially formed by differential forming elements 472. In the illustrated embodiment, the differential forming elements 472 are differential output operational amplifiers.

The DVI transmitter of FIG. 4C is capable in operating in any of four modes: Single link 1 and single link 2 modes are identical except that the data and control inputs are from different sources. In these modes, only one of the two links is enabled. In the dual single link mode, both links are enabled and controlled independently. In the dual link mode, the data is sourced to each link, but the two single links share the same controls and clock, i.e., the PRI_CLK produced by PLL 0 is used to service the secondary link components. In such case, multiplexer 457 is operated to produce the SEC_CLK from PLL 0 454, i.e., PRI_CLK and SEC_CLK are the same signal. In dual link mode, the single transmitted bit clock, TXCO+/−, is produced from PRI_CLK and services both the primary and the secondary links.

Figure 5:
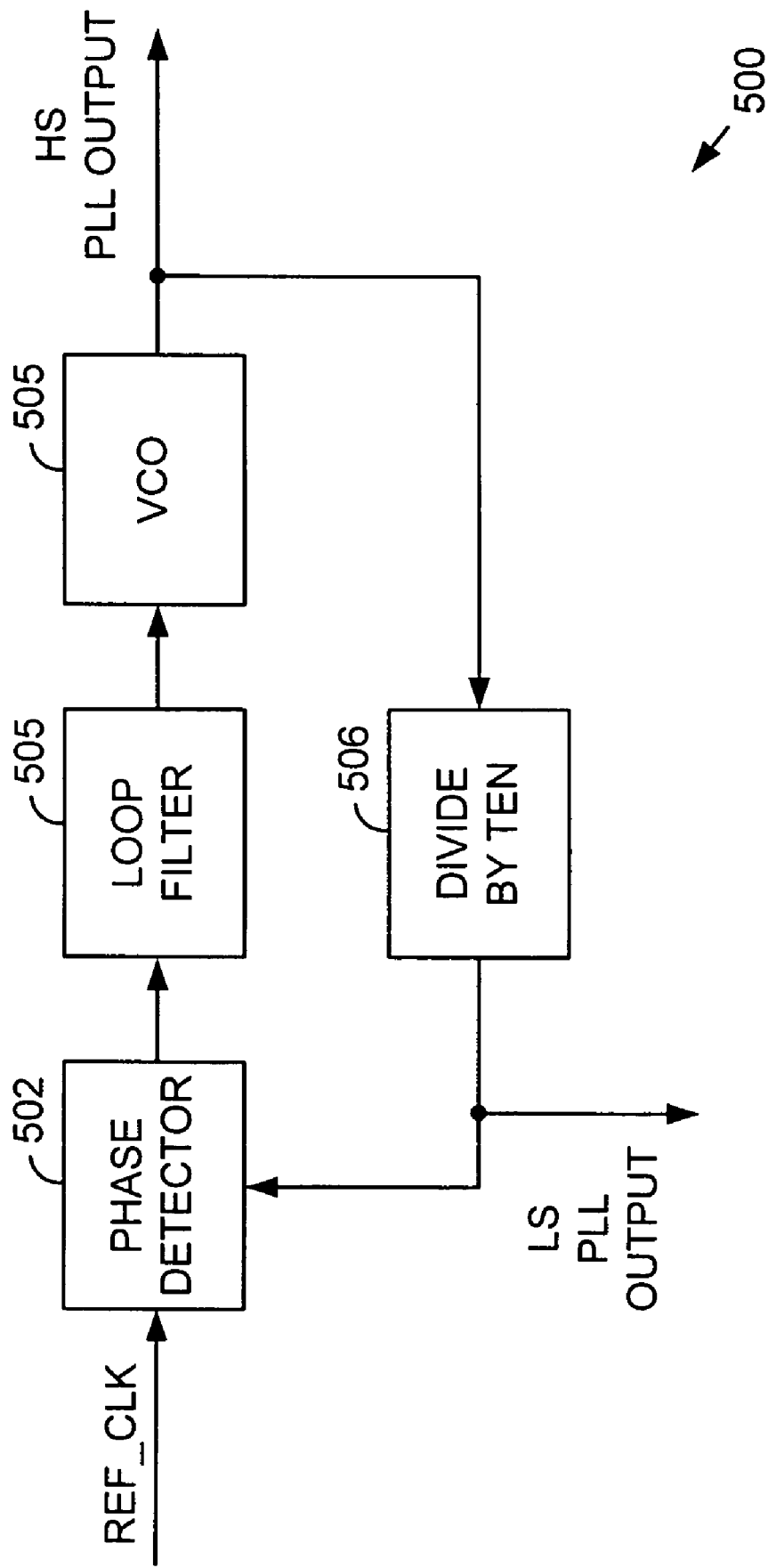
FIG. 5 is a block diagram illustrating a phase locked loop (PLL) constructed according to the present invention.

FIG. 5 is a block diagram illustrating a phase locked loop (PLL) constructed according to the present invention. The PLL includes a phase detector 502 that receives the REF_CLK produces by an input device and compares the phase of the REF_CLK to a low speed PLL output (LS_PLL_OUTPUT) produced by a divide by ten counter 506. A loop filter 505 receives the output of the phase detector 502, filters the output, and produces a filtered output as the input to a Voltage Controlled Oscillator (VCO) 505. The VCO 505 produces a high speed PLL output (HS_PLL_OUTPUT) that also serves as the input to the divide by ten counter 506.

Figure 6A:
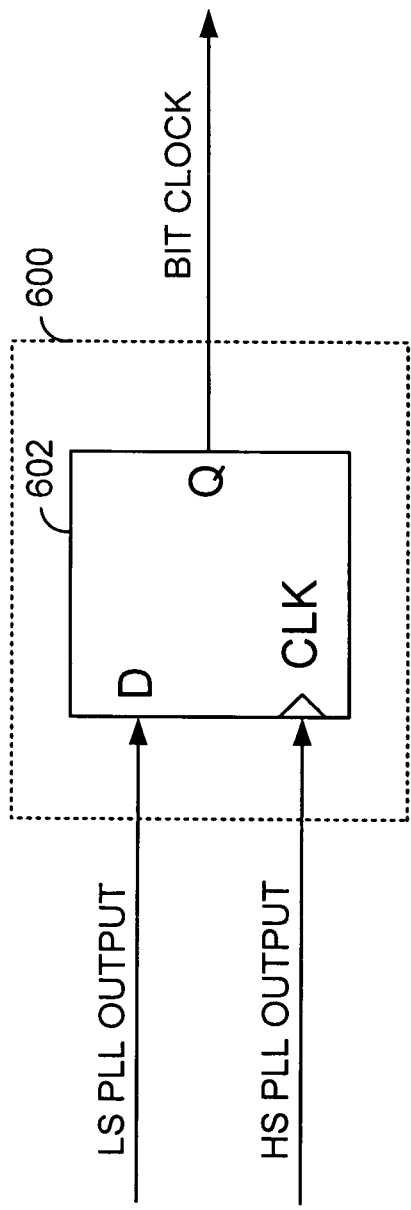
FIG. 6A is a block diagram illustrating a bit clock temporal realignment circuit constructed according to the present invention.

FIG. 6A is a block diagram illustrating a bit clock temporal realignment circuit constructed according to the present invention. The bit clock temporal realignment block 600 includes a D flip flop 602 that receives the LS_PLL_OUTPUT as its data input and the HS_PLL_OUTPUT as its CLK input. The bit clock temporal realignment block 600 produces the BIT_CLK as its output. The bit clock is also referred to as the PRI_CLK in FIG. 4C prior to its conversion to a differential signal.

Figure 6B:
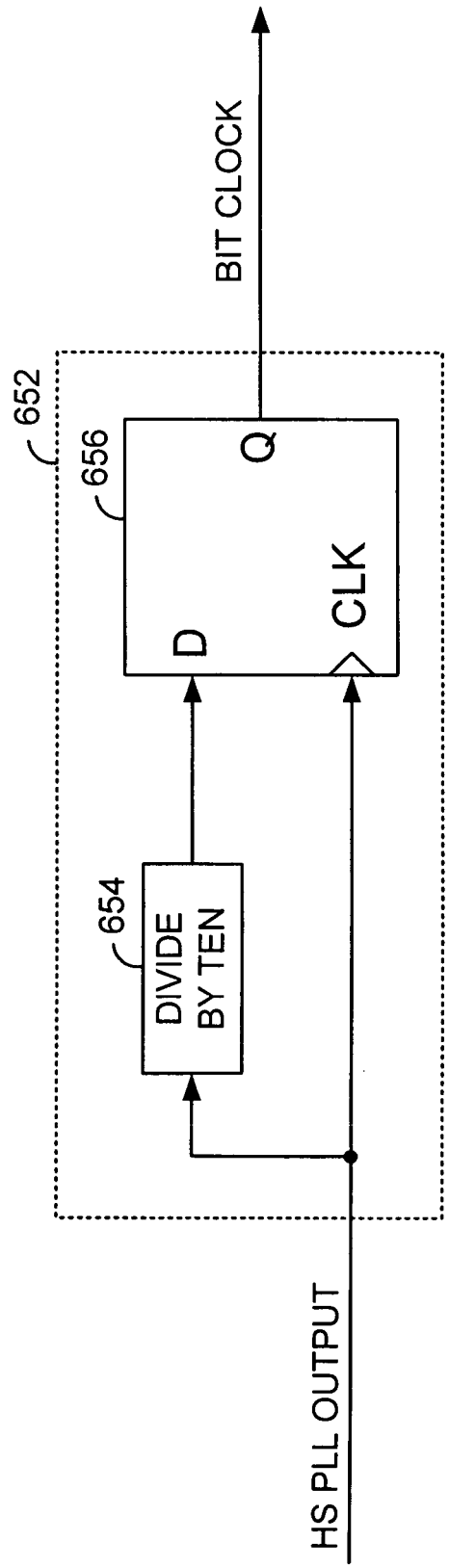
FIG. 6B is a block diagram illustrating another embodiment of a bit clock temporal realignment circuit constructed according to the present invention.

FIG. 6B is a block diagram illustrating another embodiment of a bit clock temporal realignment circuit 652 constructed according to the present invention. The bit clock temporal realignment circuit 652 receives the HS_PLL_OUTPUT signal and produces the BIT_CLK (PRI_CLK). The bit clock temporal realignment circuit 652 includes a divide by ten counter 654 that receives the HS_PLL_OUTPUT signal and that produces the data input to a D flip flop 656. The D flip flop 656 is clocked by the HS_PLL_OUTPUT signal and produces the bit clock.

Figure 7:
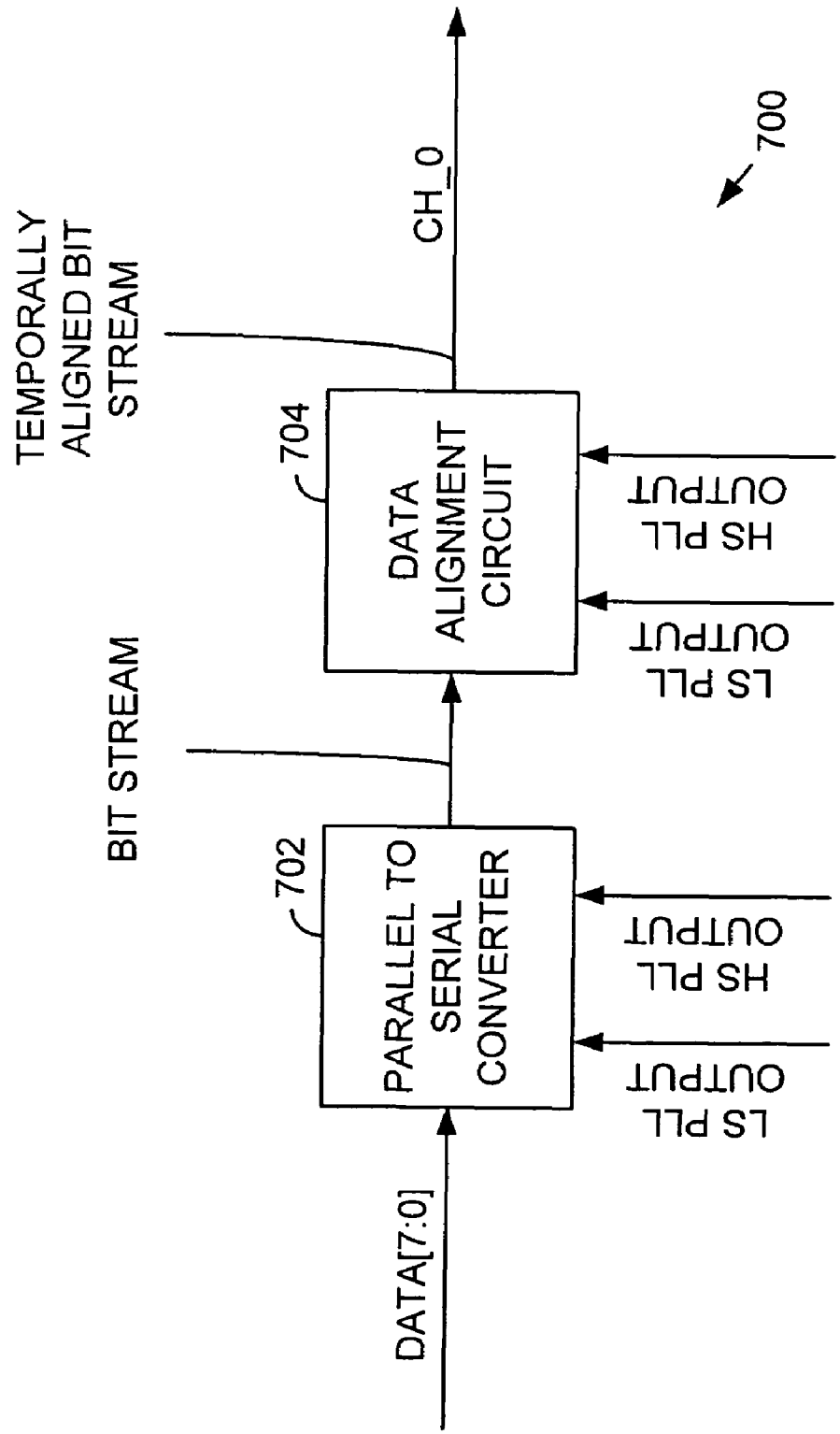
FIG. 7 is a block diagram illustrating a serializer constructed according to the present invention.

FIG. 7 is a block diagram illustrating a serializer constructed according to the present invention. The serializer includes a parallel to serial converter 702 and a data alignment circuit 704. The parallel to serial converter 702 receives a parallel data signal DATA[7:0] that is eight bits wide and converts the parallel data signal a bit stream based upon the LS_PLL_OUTPUT and/or the HS_PLL_OUTPUT, depending upon the particular embodiment employed. The bit stream produced by the parallel to serial converter 702 is received by the data alignment circuit 704 that temporally aligns the bit stream to produce a temporally aligned bit stream as channel 0, for example. Each of the six channels of a dual link transmitter constructed according to the present invention includes a data alignment circuit so that the channel data output will be temporally aligned with the BIT_CLK produced by the transmitter. In order to temporally align the data channels with the BIT_CLK, the data alignment circuit 704 uses the LS_PLL_OUTPUT and/or the HS_PLL_OUTPUT.

The invention disclosed herein is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

The invention claimed is:

1. An apparatus comprising:
    a primary link transmitter having a plurality of primary link data channels to transmit encoded and serialized primary link data;
    a secondary link transmitter having a plurality of secondary link data channels to transmit encoded and serialized secondary link data; and
    a clock generator coupled to the primary link transmitter and to the secondary link transmitter to generate a primary clock signal and a secondary clock signal, wherein during a single link mode of operation the primary clock signal is used as a primary link bit clock for the primary link data channels and the secondary clock signal is selected as a secondary link bit clock for the secondary link data channels, but during a dual link mode of operation the primary clock signal is used as the primary link bit clock for the primary link data channels and also selected as the secondary link bit clock for the secondary link data channels to ensure synchronization of data on the primary link data channels and the secondary link data channels.

2. The apparatus of claim 1, wherein the clock generator includes a primary link Phase Locked Loop (PLL) to generate the primary clock signal and a secondary link PLL to generate the secondary clock signal.

3. The apparatus of claim 2 further comprising a multiplexer to select between the primary clock signal and the secondary clock signal for coupling to the secondary link transmitter.

4. The apparatus of claim 1, wherein:
    the primary link transmitter includes a plurality of primary link data channel temporal alignment blocks to align bits of the primary link data channel with the primary link bit clock; and
    the secondary link transmitter includes a plurality of secondary link data channel temporal alignment blocks to align bits of the secondary link data channel with the secondary link bit clock.

5. The apparatus of claim 1, wherein:
    the primary link transmitter further includes a first High-Bandwidth Digital Content Protection engine; and
    the secondary link transmitter further includes a second High-Bandwidth Digital Content Protection engine.

6. The apparatus of claim 1, wherein the data transmitted on the primary and secondary data channels are compliant with a particular digital standard.

7. The apparatus of claim 6, wherein the particular digital standard is a Digital Visual Interface standard.

8. An apparatus comprising:
a primary link transmitter having a plurality of primary link data channels to transmit encoded and serialized primary link data;
a secondary link transmitter having a plurality of secondary link data channels to transmit encoded and serialized secondary link data;
a secondary link Phase Locked Loop (PLL) to generate a secondary clock signal which is used by the secondary link transmitter as a secondary link bit clock for the secondary link data channels during a single link mode of operation; and
a primary link PLL to generate a primary clock signal which is used by the primary link transmitter as a primary link bit clock for the primary link data channels during the single link mode of operation, but the primary clock signal is coupled to both the primary link transmitter and the secondary link transmitter during a dual link mode of operation and to be used as the primary link bit clock and the secondary link bit clock to synchronize data on the primary link data channels and the secondary link data channels.

9. The apparatus of claim 8 further comprising a multiplexer to select between the primary clock signal and the secondary clock signal for coupling to the secondary link transmitter.

10. The apparatus of claim 8, wherein:
the primary link transmitter includes a plurality of primary link data channel temporal alignment blocks to align bits of the primary link data channel with the primary link bit clock; and
the secondary link transmitter includes a plurality of secondary link data channel temporal alignment blocks to align bits of the secondary link data channel with the secondary link bit clock.

11. The apparatus of claim 8, wherein:
the primary link transmitter further includes a first High-Bandwidth Digital Content Protection engine; and
the secondary link transmitter further includes a second High-Bandwidth Digital Content Protection engine.

12. The apparatus of claim 8, wherein the data transmitted on the primary and secondary data channels are compliant with a particular digital standard.

13. The apparatus of claim 12, wherein the particular digital standard is a Digital Visual Interface standard.

14. A method comprising:
generating a primary clock signal;
generating a secondary clock signal;
using the secondary clock signal as a secondary link bit clock to transmit encoded and serialized secondary link data on a plurality of secondary link data channels during a single link mode of operation; and
using the primary clock signal as a primary link bit clock to transmit encoded and serialized primary link data on a plurality of primary link data channels during the single link mode of operation, but during a dual link mode of operation, using the primary clock signal as both the primary link bit clock and the secondary link bit clock to synchronize dual link data on the primary link data channels and the secondary link data channels.

15. The method of claim 14, wherein generating the primary clock signal includes generating a phase locked loop clock signal.

16. The method of claim 15, further comprising transmitting data on the primary and secondary data channels that are compliant with a particular digital standard.

17. The method of claim 16, wherein the particular digital standard is a Digital Visual Interface standard.

* * * * *